(12) United States Patent
Lee

(10) Patent No.: US 9,355,835 B2
(45) Date of Patent: May 31, 2016

(54) METHOD AND APPARATUS FOR PROCESSING SUBSTRATE

(71) Applicant: Semes Co., Ltd., Cheonan-si, Chungcheongnam-do (KR)

(72) Inventor: TaekYoub Lee, Cheonan-si (KR)

(73) Assignee: SEMES CO., LTD., Chungheongnam-Do (KR)

( * ) Notice: Subject to any disclaimer, the term of this patent is extended or adjusted under 35 U.S.C. 154(b) by 0 days.

(21) Appl. No.: 13/928,781

(22) Filed: Jun. 27, 2013

(65) Prior Publication Data

US 2014/0000659 A1 Jan. 2, 2014

(30) Foreign Application Priority Data

Jun. 29, 2012 (KR) .................. 10-2012-0071095
Oct. 4, 2012 (KR) .................. 10-2012-0110148

(51) Int. Cl.
*H01L 21/02* (2006.01)
*H01L 21/67* (2006.01)

(52) U.S. Cl.
CPC .... *H01L 21/02052* (2013.01); *H01L 21/02057* (2013.01); *H01L 21/67051* (2013.01); *H01L 21/67075* (2013.01)

(58) Field of Classification Search
CPC ................... H01L 21/02052; H01L 21/02057
USPC ............... 134/94.1, 99.1, 144, 147, 148, 149, 134/151, 157, 172, 180, 181, 198
See application file for complete search history.

(56) References Cited

U.S. PATENT DOCUMENTS

| 5,896,875 | A | * | 4/1999 | Yoneda | B08B 3/02 134/100.1 |
| 6,383,331 | B1 | * | 5/2002 | Sumnitsch | 156/345.1 |
| 2010/0212692 | A1 | * | 8/2010 | Sundaram | A47L 15/0049 134/18 |

FOREIGN PATENT DOCUMENTS

| JP | 2000-343016 A | 12/2000 |
| JP | 2004-193538 A | 7/2004 |
| JP | 2009-246190 A | 10/2009 |
| JP | 2010050226 A | * 3/2010 |
| KR | 20060053145 A | 5/2006 |
| KR | 10-0682538 B1 | 2/2007 |
| KR | 20080020485 A | 3/2008 |
| KR | 20080031618 A | 4/2008 |
| KR | 10-2008-0088822 | 10/2008 |
| KR | 20090055995 A | 6/2009 |
| KR | 10-0938238 B1 | 1/2010 |

OTHER PUBLICATIONS

Machine Translation of Kikuchi, JP 2010050226 A, Mar. 4, 2010.*

* cited by examiner

*Primary Examiner* — David Cormier
(74) *Attorney, Agent, or Firm* — Harness, Dickey & Pierce, P.L.C.

(57) ABSTRACT

Provided are a substrate processing apparatus and method. The substrate processing apparatus includes a substrate support member on which a substrate is placed and a movable spray member supplying a fluid onto the substrate placed on the substrate support member. The movable spray member includes a first nozzle arm rotating to spray at least one fluid and a second nozzle arm disposed on the first nozzle arm to spray at least one fluid.

13 Claims, 9 Drawing Sheets

METHOD AND APPARATUS FOR PROCESSING SUBSTRATE

CROSS-REFERENCE TO RELATED APPLICATIONS

This U.S. non-provisional patent application claims priority under 35 U.S.C. §119 of Korean Patent Application Nos. 10-2012-0071095, filed on Jun. 29, 2012, and 10-2012-0110148, filed on Oct. 4, 2012, the entire contents of which are hereby incorporated by reference.

BACKGROUND OF THE INVENTION

The present invention disclosed herein relates to a system for processing a substrate, and more particularly, to a substrate processing apparatus that sprays a chemical solution onto a substrate to clean a surface of the substrate and a substrate processing method.

With the tendency of high density, high integration, and high performance of semiconductor devices, micronization of circuit patterns is a rapidly progressing. As a result, contaminants such as particles, organic contaminants, metal contaminants, and the like, which remain on a surface of a substrate have a large impact on device characteristics and yield rate of production. Thus, a cleaning process for removing various contaminants attached to a surface of a substrate is becoming the main issue. The substrate cleaning process is performed before and after each of unit processes for manufacturing semiconductors.

In general, various chemical solutions are used to remove photoresist. Here, each of the different chemical solutions may be provided onto the substrate through each of independent nozzle units. Thus, as kinds of chemical solutions increase, the number of nozzle units may increase to increase an equipment area.

SUMMARY OF THE INVENTION

The present invention provides a substrate processing apparatus capable of reducing an equipment area and a substrate processing method.

The present invention provides a substrate processing apparatus capable of reducing a process time and a substrate processing method.

The feature of the present invention is not limited to the aforesaid, but other features not described herein will be clearly understood by those skilled in the art from descriptions below.

Embodiments of the present invention provide substrate processing apparatuses including: a substrate support member on which a substrate is placed; and a movable spray member supplying a fluid onto the substrate placed on the substrate support member, wherein the movable spray member includes: a first nozzle arm rotating to spray at least one fluid; and a second nozzle arm disposed on the first nozzle arm to spray at least one fluid.

In some embodiments, the second nozzle arm may rotate on the first nozzle arm by a separate rotation shaft and driving source.

In other embodiments, the second nozzle arm may rotate together with the first nozzle arm while the first nozzle arm rotates.

In still other embodiments, the first and second nozzle arms may include nozzles that spray processing fluids different from each other.

In even other embodiments, the movable spray member may include: a first driving unit rotating the first nozzle arm; and a second driving unit rotating the second nozzle arm.

In yet other embodiments, the second driving unit may be disposed on the first nozzle arm.

In further embodiments, the movable spray member may further include a control unit controlling the first and second driving units.

In still further embodiments, in the movable spray member, the second nozzle arm may be provided in plurality on the first nozzle arm.

In even further embodiments, the movable spray member may further include a third nozzle arm rotating on the second nozzle arm by a separate rotation shaft and driving source to spray at least one fluid.

In other embodiments of the present invention, substrate processing methods for processing a surface of a substrate by using a first nozzle arm including a first nozzle and a second nozzle arm independently operating with respect to the first nozzle arm and including a second nozzle include: rotating the first nozzle arm together with the second nozzle arm from a starting point to one point above the substrate; spraying a processing fluid onto the substrate through the second nozzle while the second nozzle arm rotates from the one point above the substrate toward an edge of the substrate; and when the spraying of the processing fluid through the second nozzle is completed, spraying a processing fluid onto the substrate through the first nozzle while the first nozzle arm rotates from the one point above the substrate toward the edge of the substrate.

In some embodiments, in the spraying of the processing fluid through the first nozzle, the second nozzle arm may rotate in a direction opposite to the rotating direction of the first nozzle arm to prevent a position of the second nozzle arm from changing.

In other embodiments, in the spraying of the processing fluid through the first nozzle, the first and second nozzle arms may have the same rotation.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Exemplary embodiments of the present invention will be described below in more detail with reference to the accompanying drawings. Although a wafer is provided as an example of a substrate herein, technical idea and scope of the present invention are not limited thereto.

Figure 1:
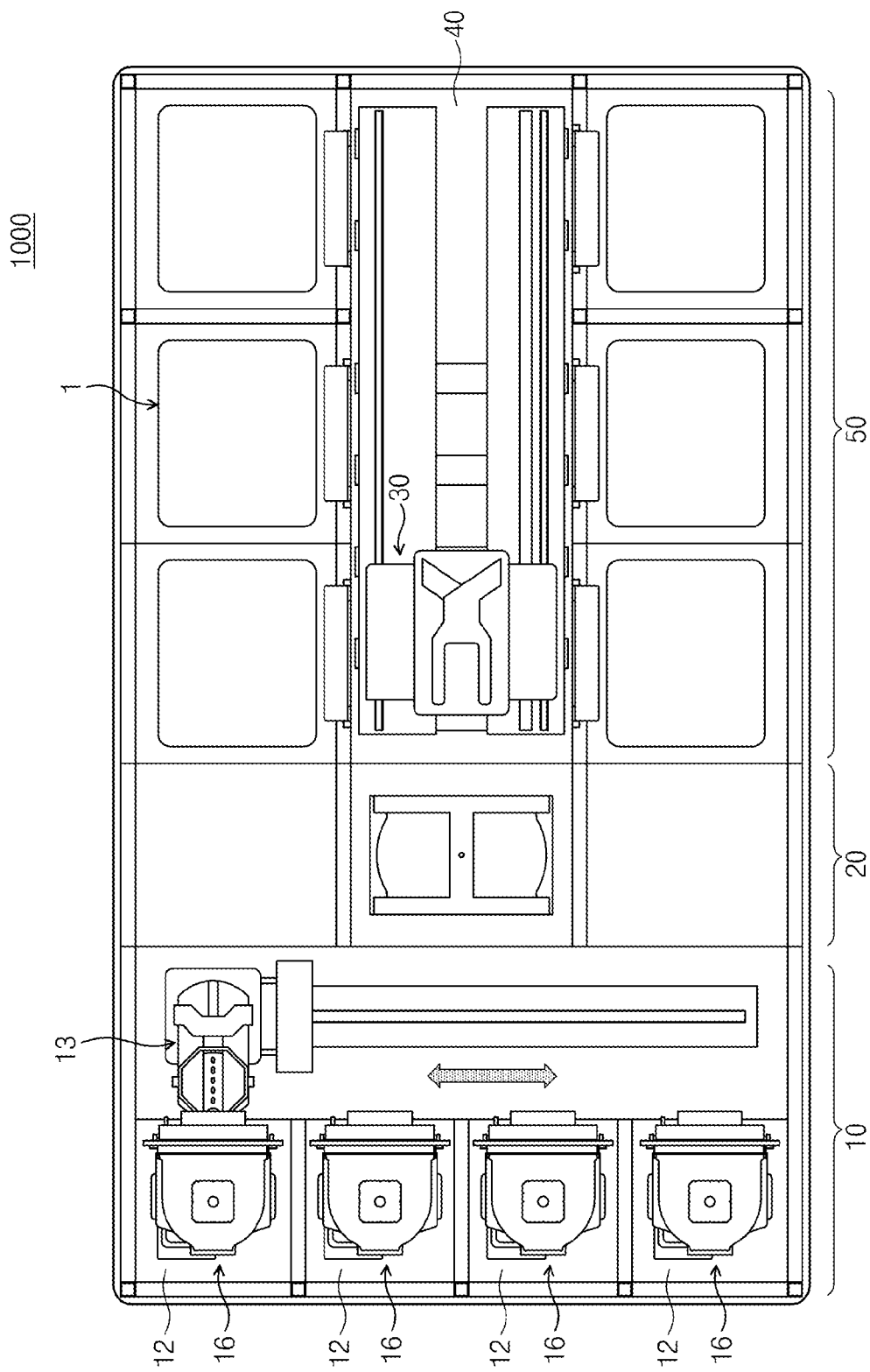
FIG. 1 is a schematic plan view of a substrate processing system.

Referring to FIG. 1, a substrate processing system 1000 according to the present invention includes an index unit 10, a butter unit 20, and a processing unit 50. The index unit 10, the buffer unit 20, and the processing unit 50 may be disposed in a line. Hereinafter, a direction in which the index unit 10, the buffer unit 20, and the processing unit 50 are arranged is referred to as a first direction. Also, when viewed from an upper side, a direction perpendicular to the first direction is referred to as a second direction, and a direction perpendicular to a plane including the first and second directions is referred to as a third direction.

The index unit 10 is disposed on a front side of the substrate processing system 1000 in the first direction. The index unit 10 includes four load ports 12 and one index robot 13.

The four load ports 12 are disposed on a front side of the index unit 10 in the first direction. The load ports 12 are provided in plurality. The plurality of load ports 12 are arranged along the second direction. The number of load ports 12 may increase or decrease according to process efficiency and foot print conditions of the substrate processing system 1000. A carrier (e.g., a cassette or a FOUP) in which a substrate W to be processed and a processed substrate W is accommodated is seated on each of the load ports 12. A plurality of slots for accommodating substrates in a state where the substrates are disposed parallel to the ground are defined in the carrier 16.

The index robot 13 is disposed adjacent to the load ports 12 in the first direction. The index robot 13 is disposed between the load ports 12 and the butter unit 20. The index robot 13 transfers the substrate W waited on an upper floor of the buffer unit 20 into the carrier 16 or the substrate W waited in the carrier 16 into a lower floor of the buffer unit 20.

The buffer unit 20 is disposed between the index unit 10 and the processing unit 50. The buffer unit 20 provides a place in which the substrate W to be transferred by the index robot 13 or the processed substrate W to be transferred by a main transfer robot 30 is temporarily accommodated or waited.

The main transfer robot 30 is disposed on a moving path 40 to transfer the substrate W between each of substrate processing apparatuses 1 and the buffer unit 20. The main transfer robot 30 transfers the substrate W to be processed, which is waited in the buffer unit 20, into each of the substrate processing apparatuses 1 or transfers the substrate W processed in each of the substrate processing apparatuses 1 into the buffer unit 20.

The moving path 40 is disposed with the processing unit 50 in the first direction to provide a path through which the main transfer robot 30 moves. The substrate processing apparatuses 1 are disposed on both sides of the moving path 40 in the first direction to face each other. A moving rail through which the main transfer robot 30 moves in the first direction and is elevatable to upper and lower floors of each of the substrate processing apparatuses 1 and the upper and lower floors of the buffer unit 20 is disposed on the moving path 40.

The substrate processing apparatuses 1 are disposed on both sides of the moving path 40 on which the main transfer robot 30 is disposed to face each other. The substrate processing system 1000 includes the plurality of upper and lower substrate processing apparatuses 1. However, the number of substrate processing apparatuses 1 may increase or decrease according to the process efficiency and foot print conditions of the substrate processing system 1000. Each of the substrate processing apparatuses 1 may be provided as an independent housing. Thus, a process for separately processing a substrate may be performed within each of the substrate processing apparatuses.

In following embodiments, an apparatus for cleaning a substrate by using processing fluids such as high-temperature sulfuric acid, alkaline chemical solution (including ozone water), acid chemical solution, rising solution, dry gas (gas containing IPA) may be described as an example. However, technical features of the present invention are not limited thereto. For example, the technical features of the present invention may be applied to various kinds of apparatuses which perform a process while rotating a substrate, such as an etching process.

Figure 2:
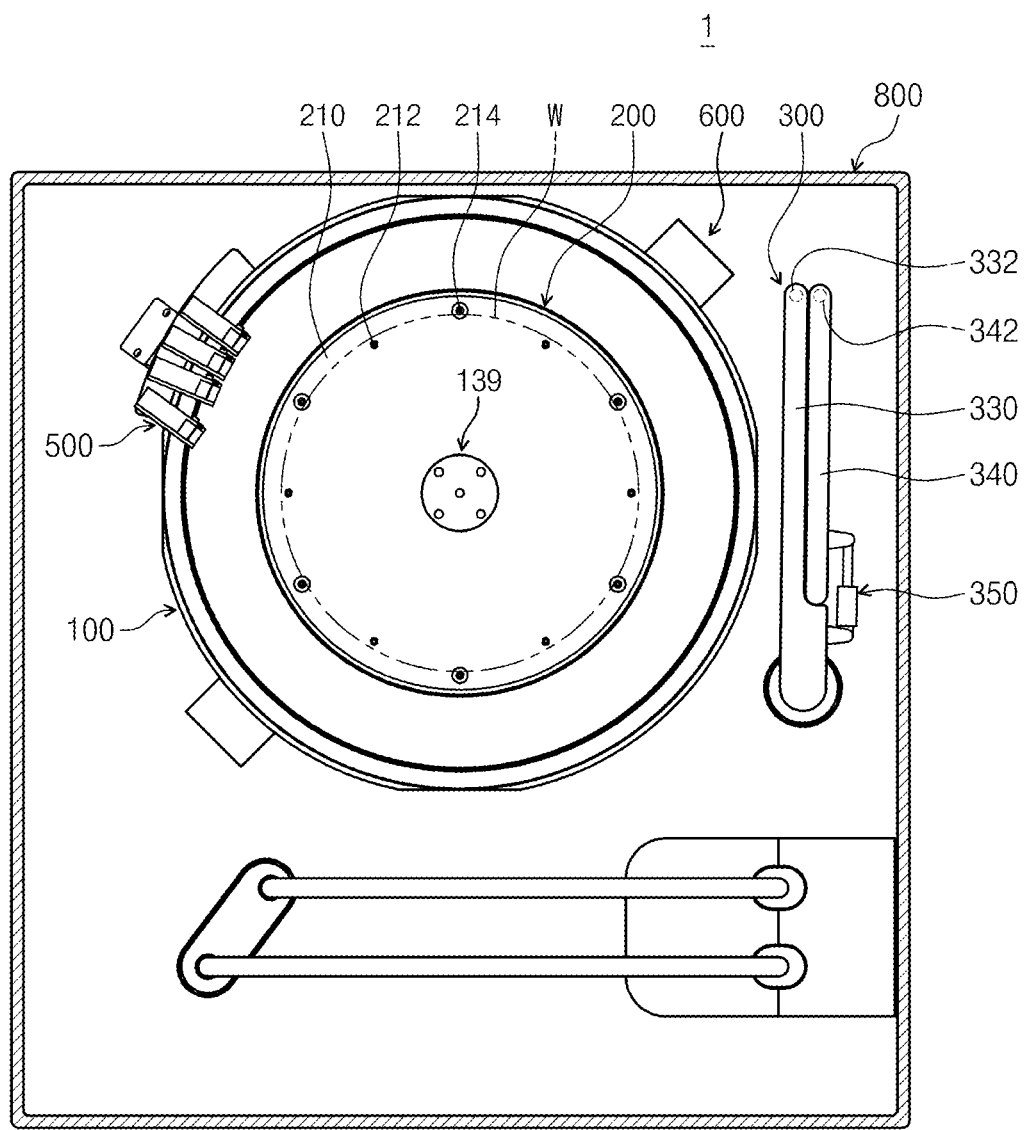
FIG. 2 is a plan view of a substrate processing apparatus according to the present invention.
Figure 3:
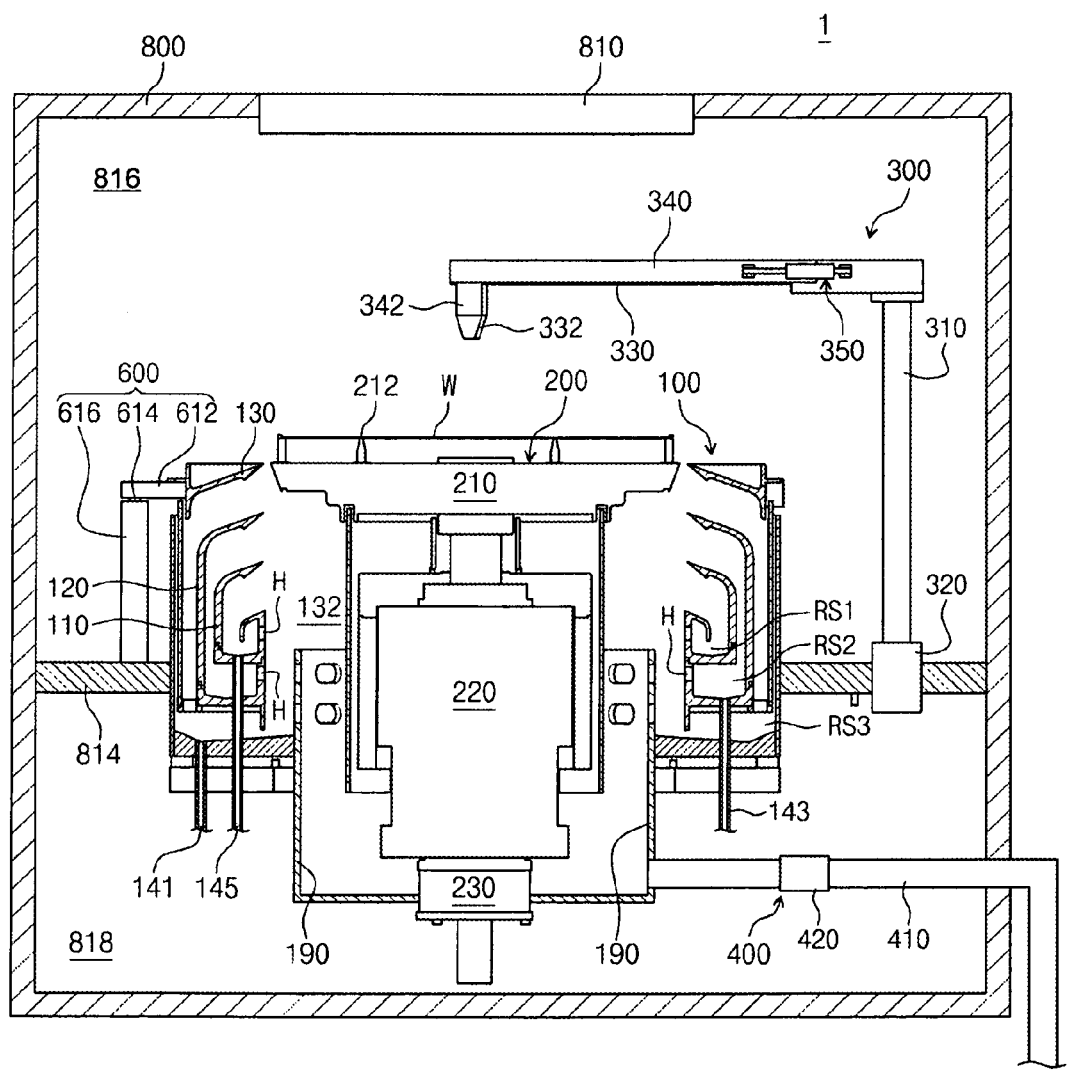
FIG. 3 is a side cross-sectional view of the substrate processing apparatus according to the present invention.

FIG. 2 is a plan view of a substrate processing apparatus according to the present invention. FIG. 3 is a side cross-sectional view of the substrate processing apparatus according to the present invention. In FIG. 3, for convenience in drawing, a fixed nozzle member is omitted.

Although a semiconductor substrate as a substrate processed by using a single type substrate processing apparatus 1 is exemplified in the current embodiment, the present invention is not limited thereto. For example, the present invention may also be applied to various substrates such as a glass substrate.

Referring to FIGS. 2 and 3, a single type substrate processing apparatus 1 according to the present invention may be an apparatus for removing foreign substances and membranes which remain on a surface of a substrate by using various processing fluids. The single type substrate process apparatus 1 includes a chamber 800, a processing container 100, a substrate support member 200, a movable spray member 300, a fixed nozzle 500, and an exhaust member 400.

The chamber 800 provides a sealed inner space, and a fan filter unit 810 is disposed on an upper portion of the chamber 800. The fan filter unit 810 generates vertical air current within the chamber 800.

A filter and an air supply fan are modularized as one unit to constitute the fan film unit 810. The fan filter unit 810 may be a unit for filtering clean air to supply the clean air into the chamber 800. The clean air may pass through the fan filter unit 810 and be supplied into the chamber 800 to generate the vertical air current. The vertical air current may provide uniform air current on the substrate. Thus, contaminants (fume) generated while a surface of a substrate is processed by a processing fluid are discharged together with the air through suction ducts of the processing container 100 into the exhaust member 400 and thus are removed to maintain high purity in the processing container 100.

As shown in FIG. 2, the chamber 800 may be partitioned into a process region 816 and a repairing region 818 by a horizontal partition wall 814. Although only portions of the regions are illustrated in drawings, the repairing region 818 provides a space in which recovery lines 141, 143, and 145 and a sub exhaust line 410 which are connected to the processing container 100, a driving unit of an elevation unit, a driving unit connected to movable nozzles 310 of the movable nozzle member 300, and a supply line are disposed, and the repairing area 818 is isolated from the process region in which the substrate is processed.

The process container 100 has a cylindrical shape with an opened upper portion to provide a process space in which a substrate W is processed. The opened upper portion of the process container 100 serves as a path for loading or unloading the substrate W. The substrate support member 200 is disposed in the process space. The substrate support member 200 supports and rotates the substrate W while the process is performed.

The processing container 100 provides an upper space in which a spin head 210 is disposed and a lower space separated from the upper space by the spin head 210. Here, an exhaust duct 190 may be connected to a lower end of the process container 100 to forcibly exhaust the inside of the chamber 800. First, second, and third suction ducts 110, 120, and 130 each having an annular shape to introduce and suction chemical solutions and gases scattered from the rotating substrate are disposed in the upper space of the processing container 100 in multi-stages.

The first, second, and third suction ducts 110, 120, and 130 each having the annular shape have exhaust holes H communicating with one common annular space (corresponding to a lower space of the container). The exhaust duct 190 connected to the exhaust member 400 is disposed in the lower space of the processing chamber 100.

Particularly, each of the first to third suction ducts 110, 120, and 130 includes a bottom surface having an annular ring shape and a sidewall extending from the bottom surface and having a cylindrical shape. The second suction duct 120 surrounds the first suction duct 110 and is spaced apart from the first suction duct 110. The third suction duct 130 surrounds the second suction duct 120 and is spaced apart from the second suction duct 120.

The first to third suction ducts 110, 120, and 130 provide first to third recovery spaces RS1, RS2, and RS3 through which the processing solutions scattered from the substrate W and the air current containing the fume are introduced, respectively. The first recovery space RS1 is defined by the first suction duct 110, and the second recovery space RS2 is defined by a space spaced between the first suction duct 110 and the second suction duct 120. The third recovery space RS3 is defined by a space spaced between the second suction duct 120 and the third suction duct 130.

A top surface of each of the first to third suction ducts 110, 120, and 130 includes an opened central portion and an inclined surface which is gradually away from a corresponding bottom surface from the connected sidewall toward the opening thereof. Thus, the processing solutions scattered from the substrate W may flow into the recovery spaces RS1, RS2, and RS3 along the top surfaces of the first to third suction ducts 110, 120, and 130, respectively.

A first processing solution introduced into the first recovery space RS1 is discharged to the outside through a first recovery line 141. A second processing solution introduced into the second recovery space RS2 is discharged to the outside through a second recovery line 143. A third processing solution introduced into the second recovery space RS3 is discharged to the outside through a third recovery line 145.

The processing container 100 is coupled to an elevation unit 600 for changing a vertical position of the process container 100. The elevation unit 600 straightly moves the processing container 100 in a vertical direction. As the processing container 100 vertically moves, a relative height of the processing container 100 with respect to the spin head 210 may change.

The elevation unit 600 includes a bracket 612, a moving shaft 614, and a driver 616. The bracket 612 is fixed to an outer wall of the processing container 100. The moving shaft 612 vertically moving by the driver 616 is fixedly coupled to the bracket 612. When the substrate W is loaded into or unloaded from the spin head 210, the processing container 100 descends so that the spin head protrudes upward from the processing container 100. Also, while the process is performed, the processing container 100 may be adjusted in height so that the processing solutions are respectively introduced into the suction ducts 110, 120, and 130 according to kinds of processing solutions supplied onto the substrate W. Thus, a relative vertical position between the processing container 100 and the substrate W may change. Thus, in the processing container 100, different processing solutions and gases may be recovered into the recovery spaces RS1, RS2, and RS3, respectively.

In the current embodiment, the substrate processing apparatus 1 vertically moves the processing container 100 to change a relative vertical position between the processing container 100 and the substrate support member 200. Alternatively, the substrate processing apparatus 1 may vertically move the substrate support member 200 to change a relative vertical position between the processing container 100 and the substrate support member 200.

The substrate support member 200 is disposed inside the processing container 100. The substrate support member 200 may support the substrate W while the process is performed. Also, the substrate support member 200 may rotate by the driver 240 that will be described later while the process is performed. The substrate support member 200 includes the spin head 210 having a circular top surface. Support pins 212 and chucking pins 214 which support the substrate W are disposed on the top surface of the spin head 210. The support pins 212 are arranged spaced apart from each other on an edge of the top surface of the spin head 210. Also, the support pins 212 protrude upward from the spin head 210. The support pins 212 support a bottom surface of the substrate W so that the substrate W is spaced upward from the spin head 210. The chucking pins 214 are disposed outside the support pins 212, respectively. Also, the chucking pins 214 protrude upward. The chucking pins 214 align the substrate W so that the substrate W supported by the plurality of support pins 212 is placed in proper position on the spin head 210. While the process is performed, the chucking pins 214 contact side portions of the substrate W to prevent the substrate W from getting out of the proper position.

A support shaft 220 supporting the spin head 210 is connected to the lower portion of the spin head 210. Also, the support shaft 220 rotates by a driving unit 230 connected to a lower end thereof. The driving unit 230 may include a motor. As the support shaft 220 rotates, the spin head 210 and the substrate W rotate.

The exhaust member 400 provides an exhaust pressure (a suction pressure) to the suction duct, which recovers the processing solution, of the first to third suction ducts. The exhaust member 400 includes the sub exhaust line 410 connected to the exhaust duct 190 and a damper 420. The sub exhaust line 410 receives an exhaust pressure from an exhaust pump (not shown) and is connected to a main exhaust line buried in a bottom space of a semiconductor production line (fab).

Fixed nozzles 500 are disposed on an upper end of the processing container 100. Each of the fixing nozzles 500 sprays the processing fluid onto the substrate W placed on the spin head 210. A spraying angle of the fixed nozzle 500 may be adjusted according to a position of the substrate to be processed.

Figure 4:
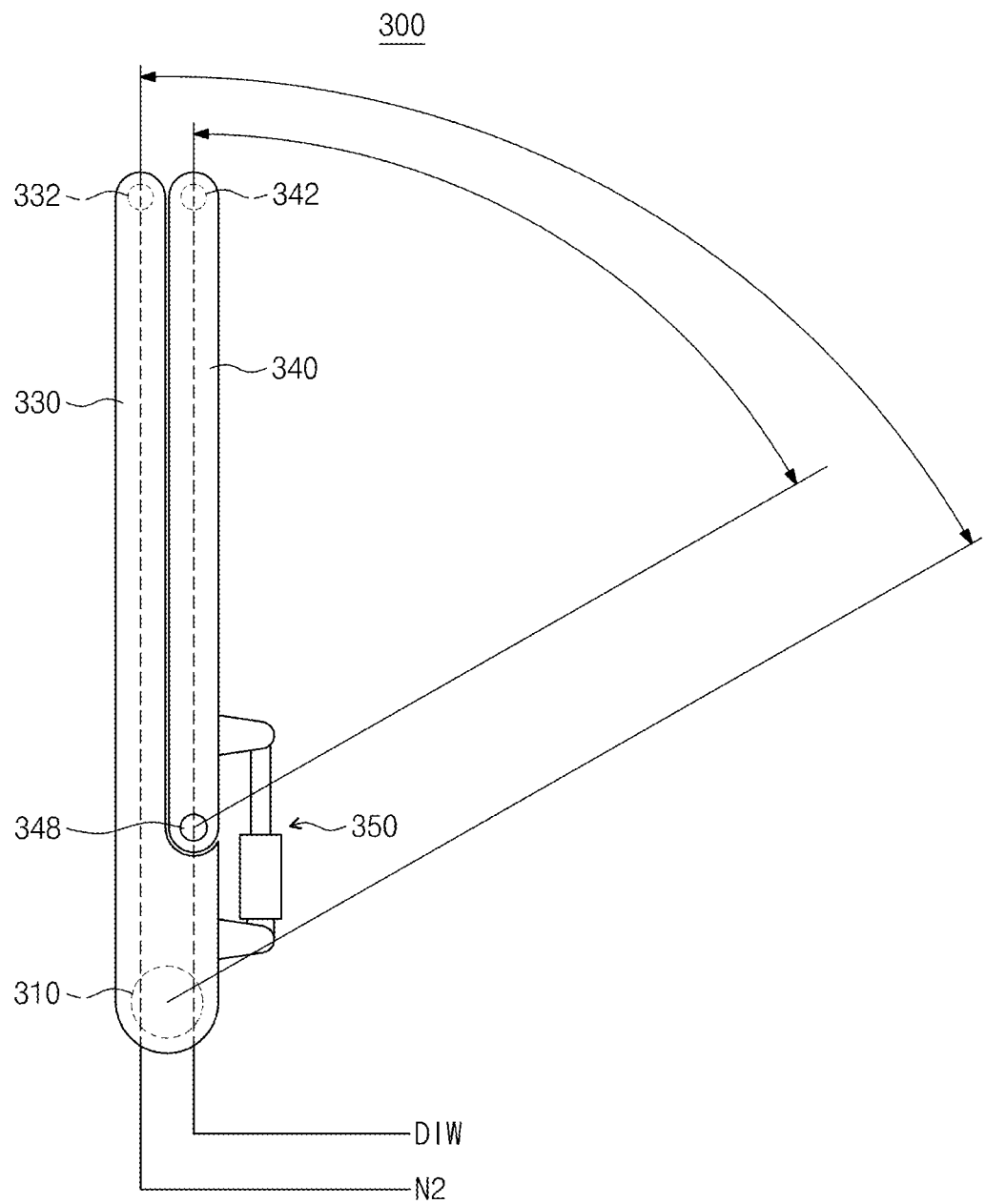
FIG. 4 is an enlarged view illustrating a main parts of a first movable spray member of FIG. 3.

FIG. 4 is an enlarged view illustrating a main parts of a first movable spray member of FIG. 3.

Referring to FIGS. 2 to 4, the first movable spray member 300 may swing to move to an upper side of a central portion of the substrate, thereby supplying a processing fluid for cleaning or etching onto the substrate.

The first movable spray member 300 includes a first driving unit 320, a first nozzle arm 330, a second nozzle arm 340, and a second driving unit 350.

The first and second nozzles 332 and 342 for spraying the processing fluids are disposed in the first and second nozzle arms 330 and 340, respectively. The first and second nozzles 332 and 342 may spray processing fluids different from each other, respectively. For example, the first nozzle 332 may spray nitrogen gas, and the second nozzle 342 may spray deionized water.

The support shaft 310 has a length direction defined in the third direction. Also, the support shaft 310 has a lower end coupled to the first driving unit 320. The first driving unit 320 rotates the support shaft 310 to allow the first nozzle arm 330 to swing. For example, the first driving unit may be provided as an assembly including a motor, a belt, and a pulley.

The first nozzle arm 330 is coupled to the support shaft 310. The first nozzle 332 is disposed in an end of the first nozzle arm 330. The first nozzle arm 330 may swing by the first driving unit 320 from a center of the substrate up to an edge of the substrate by using the support shaft as a central shaft (a first shaft).

Although not shown, the first movable spray member 300 includes an elevation driving unit providing a driving force for elevating the first nozzle arm 330 or the support shaft 310 so that the first nozzle arm 330 collides with other units adjacent thereto when the first nozzle arm 330 rotates. For example, the elevation driving unit may be provided as a linear driving unit such as a cylinder or a linear motor.

The second nozzle arm may rotate on the first nozzle arm 330 by a separate rotation shaft and driving source. The second nozzle arm 340 has one end coupled to a second shaft 348 of a first nozzle arm 330. The second nozzle 342 is disposed in the other end of the second nozzle arm 340. The second nozzle arm 340 swings with respect to the second shaft 348 by the second driving unit 350. Although the second driving unit 350 is provided as the cylinder in the current embodiment, the second driving unit 350 may include various rotating device that is capable of rotating the second nozzle arm 340 such as the assembly including the motor, the belt, and the pulley.

The processing fluid used for processing a substrate may include at least one selected from the group consisting of hydrofluoric acid (HF), sulfuric acid ($H_2SO_4$), hydrogen ($H_2O_2$), nitrogen gas, nitric acid ($HNO_3$), phosphoric acid ($H_3PO_4$), ozone water, and SC-1 solution (mixed solution of ammonium hydroxide ($NH_4OH$), hydrogen ($H_2O_2$), and water ($H_2P$)). Deionized water (DIW) may be used as a rinsing solution. Isopropyl alcohol gas (IPA) may be used as dry gas.

As described above, since the first movable spray member 400 provides the plurality of nozzle arms, an equipment area may be reduced. Also, when the process using the second nozzle is completed, the first nozzle may be waited at the center of the substrate to reduce a process time.

Although the rotation shaft of the first nozzle arm 330 and the rotation shaft of the second nozzle arm 240 are different from each other in the current embodiment, the present invention is not limited thereto. For example, the first and second nozzle arms may rotate by using the same rotation shaft. Also, although the first movable spray member 300 includes the two nozzle arms, the present invention is not limited thereto. For example, the first movable spray member 300 may include at least two nozzle arms, and each of the nozzle arms may rotate by using the same rotation shaft or rotation shafts different from each other.

Figure 5:
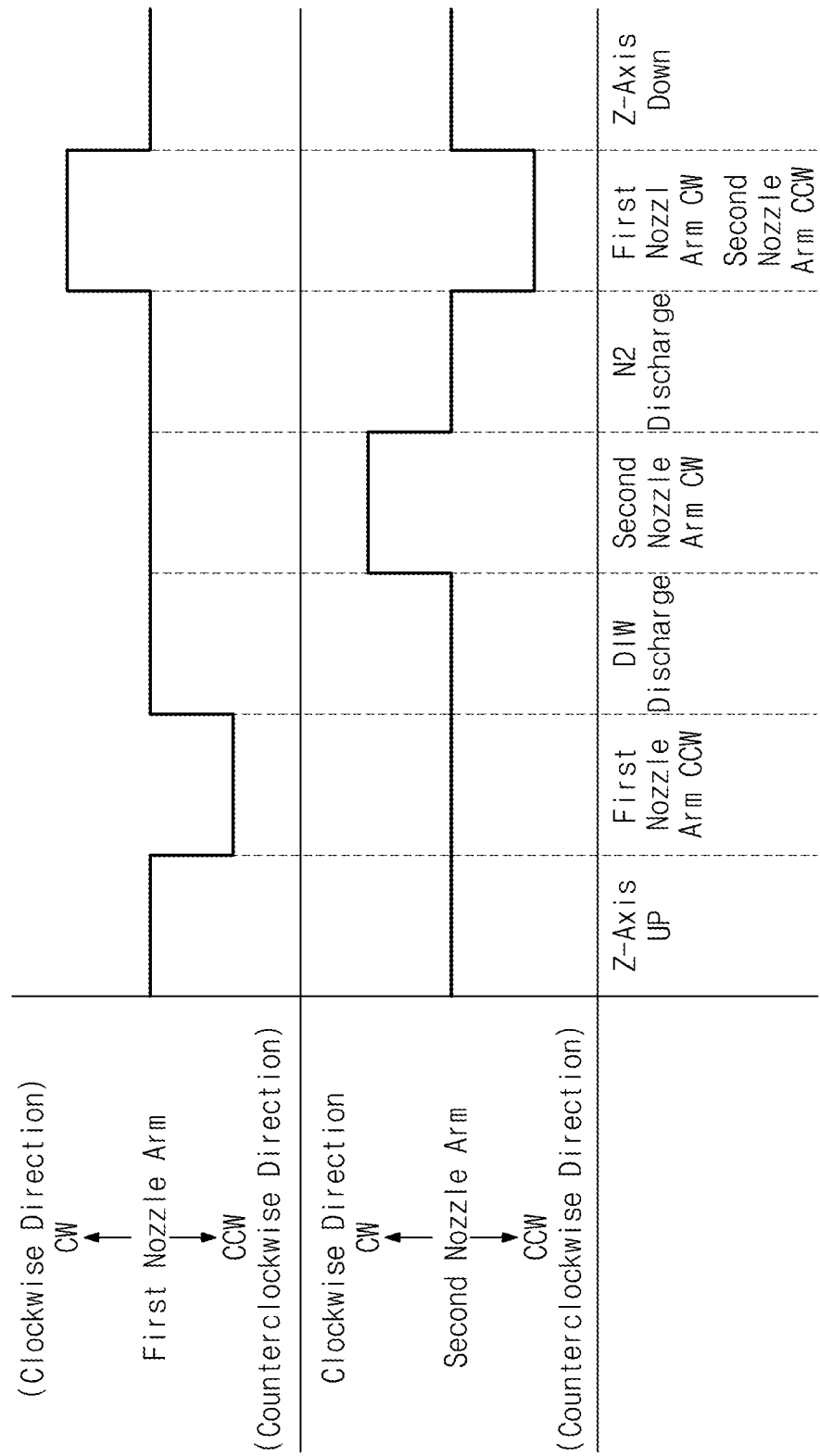
FIG. 5 is a graph illustrating a control sequence of first and second nozzle arms.

FIG. 5 is a graph illustrating a control sequence of the first and second nozzle arms, and FIGS. 6 to 9 are views illustrating an operation of the first movable spray member.

Figure 6:
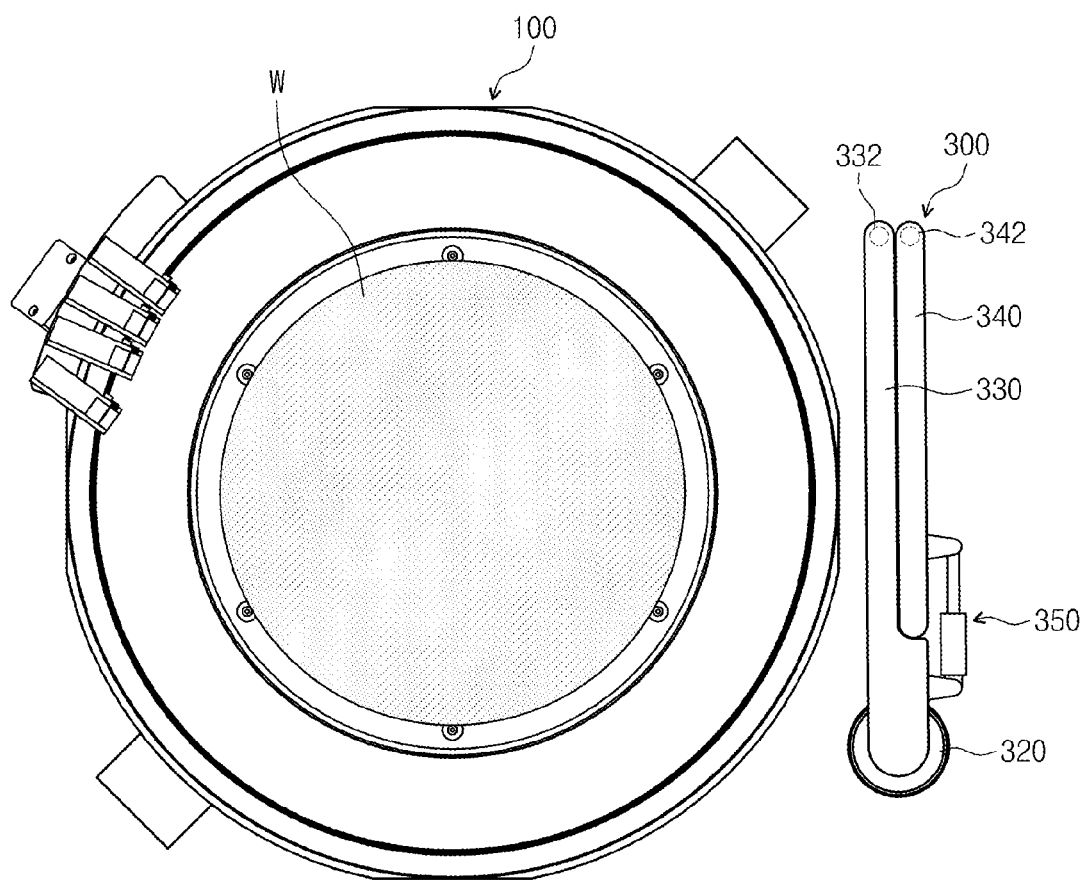
FIGS. 6 to 9 are views illustrating an operation of the first movable spray member.
Figure 7:
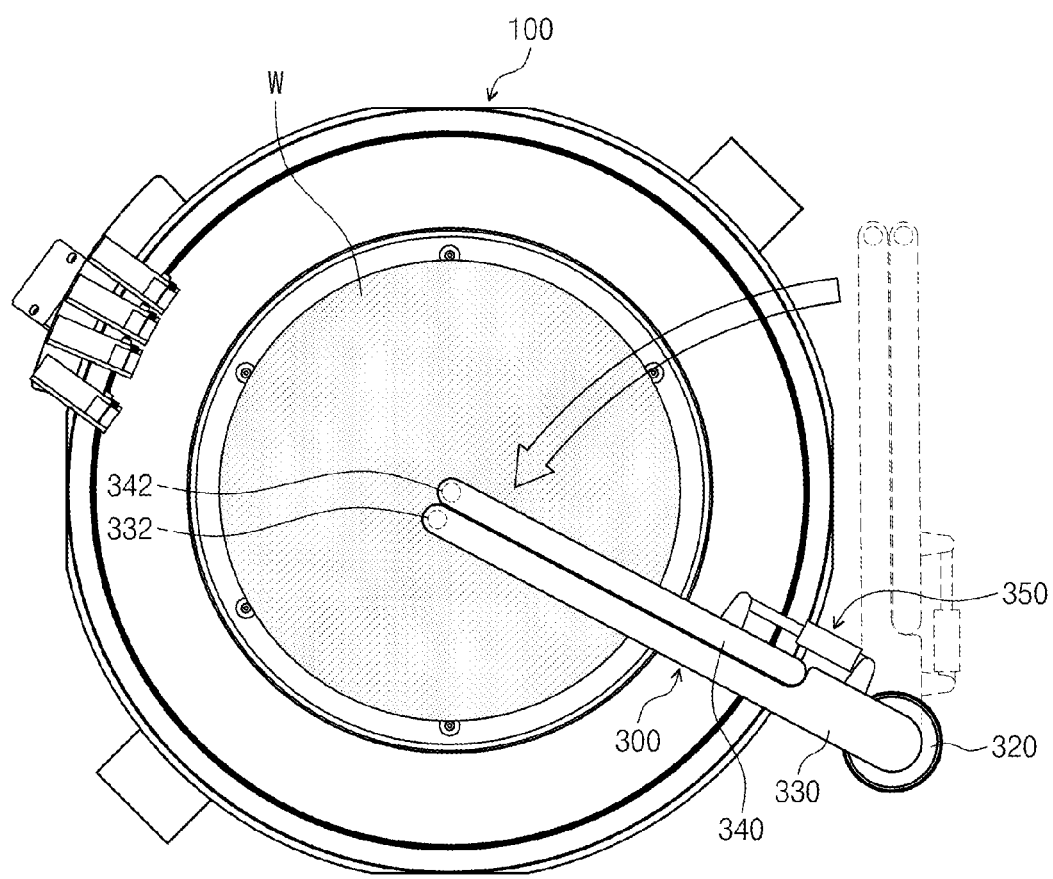
Figure 8:
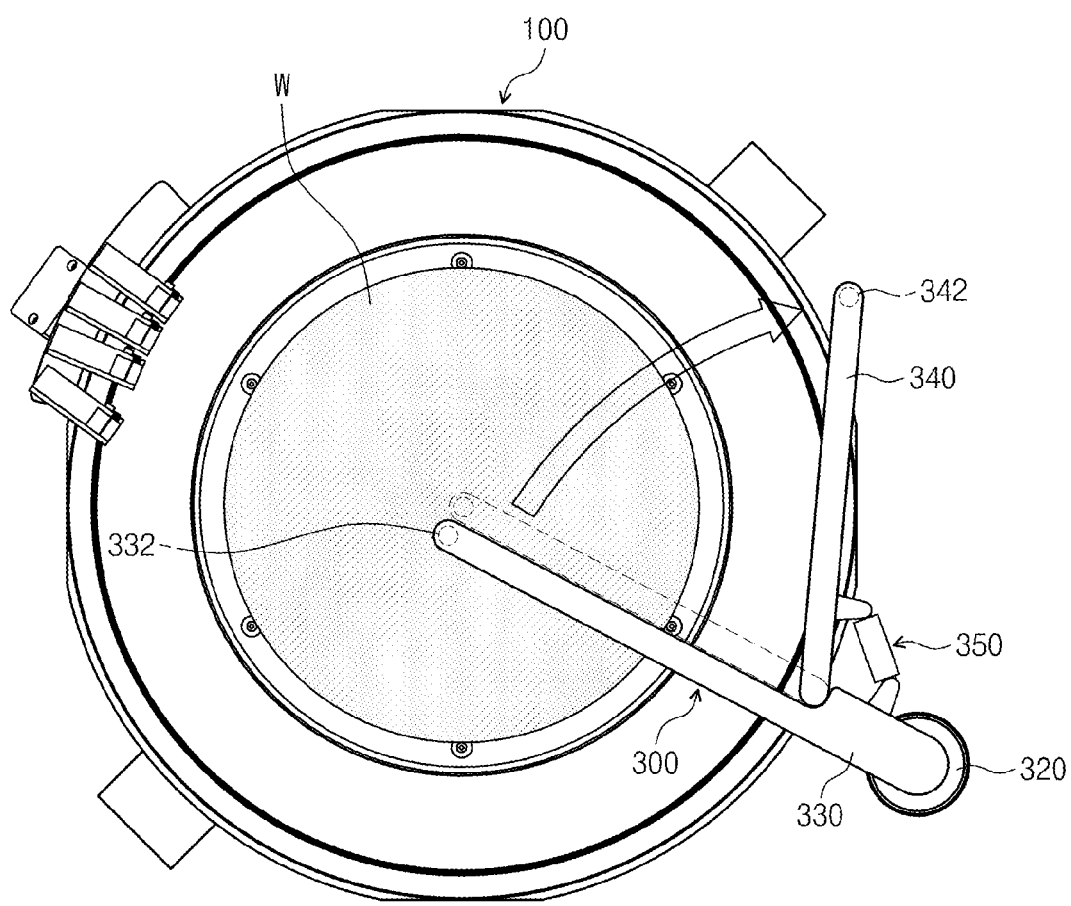

Referring to FIGS. 5 and 6, the first movable spray member 300 may be waited at a staring point. In the first movable spray member 300 waited at the starting point, the first nozzle arm 330 and the second nozzle arm 340 are disposed parallel to each other. The first and second nozzle arms 330 and 340 may be adjusted in height by using one elevation driving unit or separate elevation driving units. Alternatively, the elevation driving unit for adjusting a height of each of the first and second nozzle arms 330 and 340 may be omitted. Referring to FIGS. 5 to 8, the first nozzle arm 330 rotates in a counterclockwise direction (CCW) that is a substrate direction with respect to the first axis. For example, the first nozzle arm 330 may rotate in a clockwise direction or counterclockwise direction according to equipment components. When the first nozzle arm 330 rotates by a preset angle, a processing fluid is sprayed from the second nozzle 342. The second nozzle arm 340 disposed parallel to the first nozzle arm 330 rotates in a clockwise direction (CW). That is, the second nozzle arm 340 performs a scanning operation from a center of the substrate toward an edge of the substrate by the second driving unit 350 controlling the second shaft or operates to spray a processing fluid for a predetermined time at a preset point.

When the discharging of the processing fluid through the second nozzle 342 is completed, the second nozzle arm 340 returns from an upper side of the substrate to the starting point by the second driving unit 350 to prevent the processing fluid discharged from the second nozzle 342 from abnormally flowing (e.g., dropping of the processing fluid due to an abnormal valve). Here, the second nozzle arm 340 stops the discharging of the processing fluid at any point above the substrate to return to the starting point, or performs the scanning operation up to the edge of the substrate to spray the processing fluid and then stops the discharging of the processing fluid at the edge of the substrate to return to the starting point.

Figure 9:
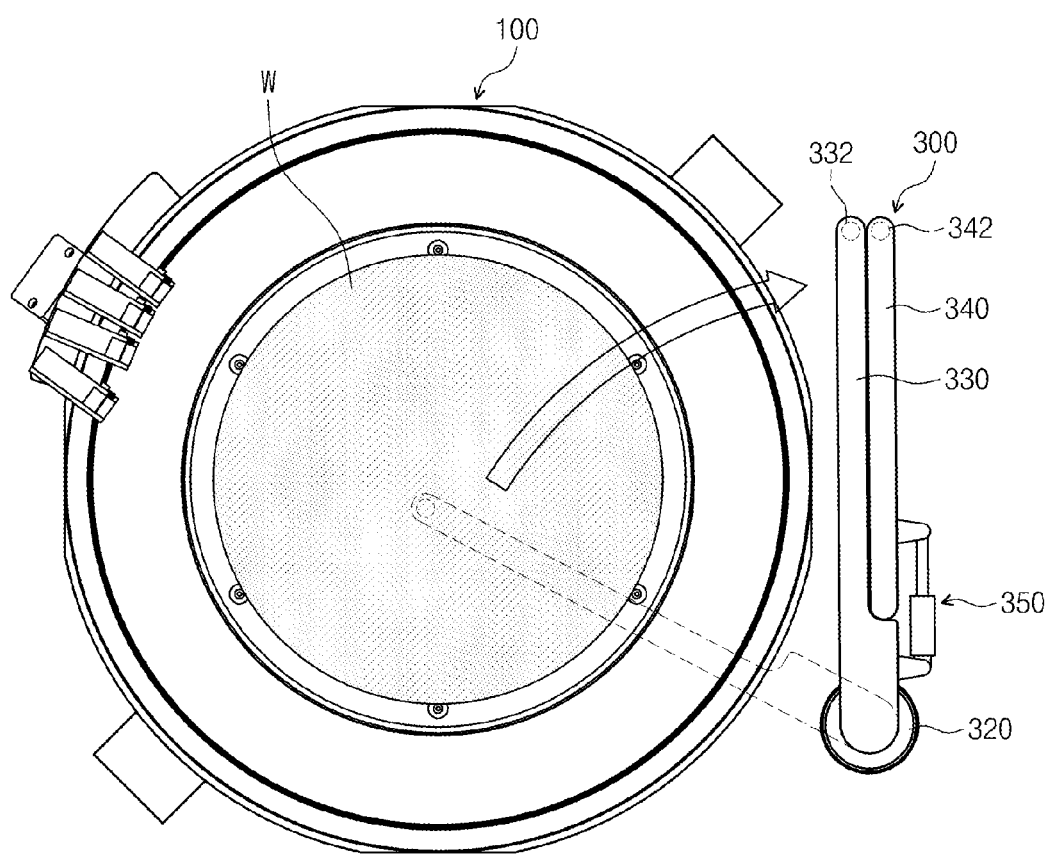

Referring to FIGS. 5 and 9, when the discharging of the processing fluid through the second nozzle 342 is completed, a processing fluid is sprayed from the first nozzle 332. That is, the first nozzle arm 330 performs a scanning operation from the center of the substrate toward the edge of the substrate by the first driving unit 320 or operates to spray a processing fluid for a predetermined time at a preset point. When the discharging of the processing fluid through the first nozzle 332 is completed, the first nozzle arm 330 returns to the starting point. Here, the second nozzle arm 340 rotates in a direction opposite to the rotation direction of the first nozzle arm 330. Then, when the first nozzle arm 330 returns to the starting point, the second nozzle arm 340 is maintained at the starting point. The first nozzle arm 330 and the second nozzle arm 340 may rotate at the same rotating rate to prevent the starting point of the second nozzle arm 340 from being changed while the first nozzle arm 330 returns to the starting point. Also, the first nozzle arm 330 stops the discharging of the processing fluid at any point above the substrate to return to the starting point while returning to the starting point, or performs the scanning operation up to the edge of the substrate to spray the processing fluid and then stops the discharging of the processing fluid at the edge of the substrate to return to the starting point.

According to the present invention, since the second nozzle arm including the second nozzle is mounted on the first nozzle arm including the first nozzle, when a plurality of arms are provided, the equipment area may be reduced. Also, the discharge of the processing fluid may be continuously performed through the first and second nozzles to reduce the process time, thereby improving the throughput of the substrate.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A substrate processing apparatus comprising:
a substrate support member on which a substrate is placed; and
a movable spray member configured to supply a fluid onto the substrate placed on the substrate support member, the movable spray member including
a first nozzle arm configured to rotate to spray at least one fluid, and
a second nozzle arm on the first nozzle arm to spray at least one fluid,
wherein when the first nozzle arm rotates by an angle in a first direction from a starting point outside the substrate support member toward the substrate support member, the second nozzle arm is configured to rotate in a second direction opposite to the first direction, and
wherein the first nozzle arm is configured to rotate about a first axis of rotation and the second nozzle arm is configured to rotate about a second axis of rotation, and the first axis of rotation and the second axis of rotation are parallel to each other, and
wherein the first nozzle arm includes,
a first support shaft at one end thereof, the one end being opposite to an another end at which a first nozzle is disposed, and
a second support shaft arranged between the two ends, wherein the second nozzle arm is coupled to the first nozzle arm by the second support shaft.

2. The substrate processing apparatus of claim 1, wherein the second nozzle arm is configured to rotate on the first nozzle arm by the second rotation shaft and a separate driving source.

3. The substrate processing apparatus of claim 1, wherein the second nozzle arm is configured to rotate together with the first nozzle arm while the first nozzle arm rotates.

4. The substrate processing apparatus of claim 1, wherein the first and second nozzle arms comprise nozzles that are configured to spray processing fluids different from each other.

5. The substrate processing apparatus of claim 1, wherein the movable spray member comprises:
a first driving unit configured to rotate the first nozzle arm; and
a second driving unit configured to rotate the second nozzle arm.

6. The substrate processing apparatus of claim 5, wherein the second driving unit is disposed midway on the first nozzle arm.

7. The substrate processing apparatus of claim 5, wherein the movable spray member further comprises a control unit configured to control the first and second driving units.

8. The substrate processing apparatus of claim 1, wherein the second nozzle arm is arranged in parallel with the first nozzle arm.

9. The substrate processing apparatus of claim 1, wherein the first nozzle arm and the second nozzle arm are arranged on substantially a same plane in parallel with a plane defined by the substrate support member.

10. The substrate processing apparatus of claim 1, wherein the first nozzle arm is configured to rotate with respect to the first support shaft and the second nozzle arm is configured to rotate with respect to the second support shaft.

11. The substrate processing apparatus of claim 1, wherein the first nozzle arm and the second nozzle arm are configured to rotate at a same rotating rate.

12. The substrate processing apparatus of claim 1, wherein the first direction is one of a clockwise direction and a counterclockwise direction, and the second direction is the other one of the clockwise direction and the counterclockwise direction.

13. The substrate processing apparatus of claim 1, further comprising:
a controller programmed to rotate the second nozzle arm in the second direction when the first nozzle arm rotates in the first direction.

* * * * *